(12) United States Patent
Mengel et al.

(10) Patent No.: US 8,569,109 B2
(45) Date of Patent: Oct. 29, 2013

(54) METHOD FOR ATTACHING A METAL SURFACE TO A CARRIER, A METHOD FOR ATTACHING A CHIP TO A CHIP CARRIER, A CHIP-PACKAGING MODULE AND A PACKAGING MODULE

(75) Inventors: Manfred Mengel, Bad Abbach (DE); Joachim Mahler, Regensburg (DE); Khalil Hosseini, Weihmichl (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 13/172,989

(22) Filed: Jun. 30, 2011

(65) Prior Publication Data

US 2013/0001803 A1 Jan. 3, 2013

(51) Int. Cl.
*H01L 21/50* (2006.01)
*H01L 23/48* (2006.01)

(52) U.S. Cl.
USPC ........... 438/118; 438/106; 438/107; 438/123; 257/782; 257/E21.499; 257/E23.01

(58) Field of Classification Search
USPC ............................ 257/782, 783; 438/118, 119
See application file for complete search history.

(56) References Cited

U.S. PATENT DOCUMENTS

| 2007/0114676 A1* | 5/2007 | Anderson et al. | 257/787 |
| 2008/0145607 A1* | 6/2008 | Kajiwara et al. | 428/137 |
| 2009/0014873 A1* | 1/2009 | Yokota et al. | 257/737 |
| 2009/0166852 A1* | 7/2009 | Hu | 257/707 |
| 2009/0236757 A1* | 9/2009 | Mengel et al. | 257/783 |
| 2009/0273066 A1* | 11/2009 | Nikitin et al. | 257/676 |
| 2010/0270673 A1* | 10/2010 | Oppermann | 257/739 |
| 2011/0012262 A1* | 1/2011 | Morita et al. | 257/741 |
| 2011/0227233 A1* | 9/2011 | Wainerdi et al. | 257/783 |

OTHER PUBLICATIONS

T. Klassen et al.; "Cold spraying—new developments and application potential"; Helmut-Schmidt-Universitaet, Institut für Werkstofftechnik, Hamburg, Germay; pp. 17-18, Aug. 10, 010.

* cited by examiner

*Primary Examiner* — Angel Roman

(57) ABSTRACT

A method for attaching a metal surface to a carrier is provided, the method including: depositing a porous layer over at least one of a metal surface and a side of a carrier; and attaching the at least one of a metal surface and a side of a carrier to the porous layer by bringing a material into pores of the porous layer, resulting in the material forming an interconnection between the metal surface and the carrier.

29 Claims, 11 Drawing Sheets

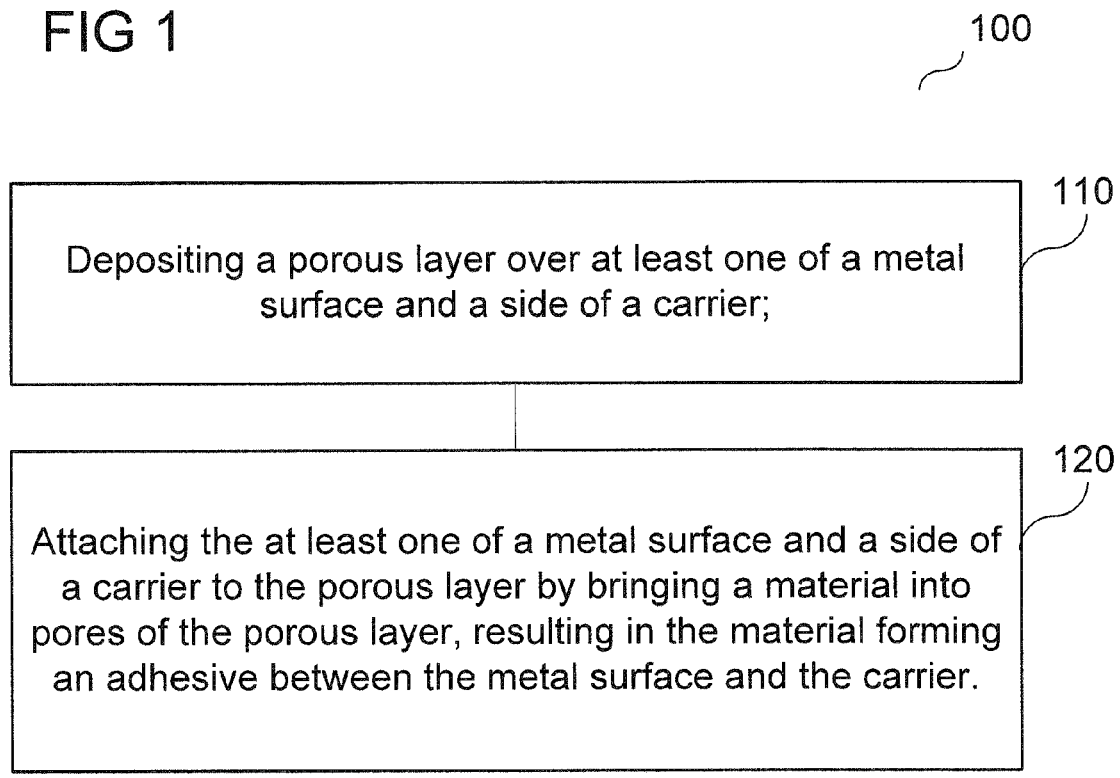

ceramic

METHOD FOR ATTACHING A METAL SURFACE TO A CARRIER, A METHOD FOR ATTACHING A CHIP TO A CHIP CARRIER, A CHIP-PACKAGING MODULE AND A PACKAGING MODULE

TECHNICAL FIELD

Various embodiments relate generally to a method for attaching a metal surface to a carrier, a method for attaching a chip to a chip carrier, chip-packaging module, and a packaging module.

BACKGROUND

Adhesive connections and joints between one or more structures are used in many areas of manufacturing, including semiconductor manufacturing. In semiconductor manufacturing, adhesive connections may be used to connect a semiconductor chip to a chip carrier, or a chip contact pad to a printed circuit board or lead frame. Adhesive connections are furthermore used in flip-chip wafer level packages for adhering a side of a chip, e.g. a chip back-side to a wafer, a printed circuit board, or a lead frame.

Many factors affect the reliability of adhesive connections between two surfaces. The quality of an adhesive connection in semiconductor manufacturing may be affected by the quality of films, e.g. metal thin films, which may be formed over the surfaces of the chip, or which may form part of the electrical circuitry of a chip. The quality of an adhesive connection may be affected by the quality of the adhesive paste, glue or solder used to connect the chip to a chip carrier.

The issue of quality regarding the deposition of metal films over semiconductor wafers affects a standard and industry-wide process in semiconductor manufacturing for producing metal tracks, metal protective layers, boundary layers, intermediate layers, bond layers, solder layers, and electrical contacts. The properties of the layers are dependent on process parameters and process limitations. Some of the factors which may be used to determine the quality of layers produced, and which are considered in the production of layers in the semiconductor industry may include the thickness of the layers. As thicker layers result in higher costs, layers may be made too thin to produce a good quality layer. Layers, especially very thin layers, may be subject to high internal mechanical stress. High mechanical stress in the layers may further be caused by the mechanical properties of adjacent layers, e.g. adjacent silicon, oxide or nitride layers placing unsuitable amounts of stress on the layers. Layers may be brittle, and some layers may cause wafer bending due to the bi-metallic effect. Current techniques for avoiding some of the problems associated with metal film deposition include making changes to the design of the layers, e.g. through the introduction of meandering structures, variation of the critical layer thickness, or conductive track width. A common technique is to introduce additional layers to compensate for mismatches in the original layers.

Adhesive materials in an adhesive connection between a chip and a chip carrier have up till now, been an adhesive paste or adhesive foil. Depending on whether a conductive or isolating adhesive connection is required, an adhesive material with different conductive or isolation properties may be used to connect or glue a component, e.g. a semiconductor chip, to a carrier.

The adhesives foils and pastes used today are, however, insufficiently reliable against stress, e.g. mechanical stress and thermal stress. Another problem is coming-up with moisture. Processing problems may also exist due to the adhesive pastes running or spreading onto the chip surfaces, causing problems for electronics. Many adhesive foils and pastes do not meet the necessary requirements for being sufficiently electrically or thermally conductive.

SUMMARY

An embodiment is a method for attaching a metal surface to a carrier, the method including: depositing a porous layer over at least one of a metal surface and a side of a carrier; and attaching the at least one of a metal surface and a side of a carrier to the porous layer by bringing a material into pores of the porous layer, resulting in the material forming an interconnection between the metal surface and the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for attaching a metal surface to a carrier according to an embodiment;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Recent improvements in the technology of depositing particles over semiconductor wafers has allowed for the deposition of thick layers of particles, e.g. layers having a thickness exceeding approximately 10 µm, at a low-cost. Progress made in the field of particle deposition may avoid some of the problems created by metal film deposition. The deposited particles may form highly porous layers, which may be deposited with a porosity of up to 50% by varying process deposition parameters. Some porous materials may suffer from the problems of being relatively inhomogeneous, and may be difficult to handle, brittle and prone to fracture and failure. Through the deposition of particles, with sizes in the nanometer and micrometer range, over a chip carrier, an adhesion process may be carried out, wherein a viscous material entangled with a porous layer may provide a stable connection between two structures.

FIG. 1 shows a method 100 for attaching a surface, e.g. a metal surface, to a carrier according to an embodiment. The surface, e.g. a metal surface, may form part of a side or surface of a structure. The method may include:

depositing a porous layer over at least one of a surface, e.g. a metal surface, and a side of a carrier (in 110); and attaching the at least one of a surface, e.g. a metal surface, and a side of a carrier to the porous layer by bringing a material into pores of the porous layer, resulting in the material forming an interconnection, e.g. forming an adhesive, between the surface, e.g. metal surface, and the carrier (in 120).

Figure 2A:
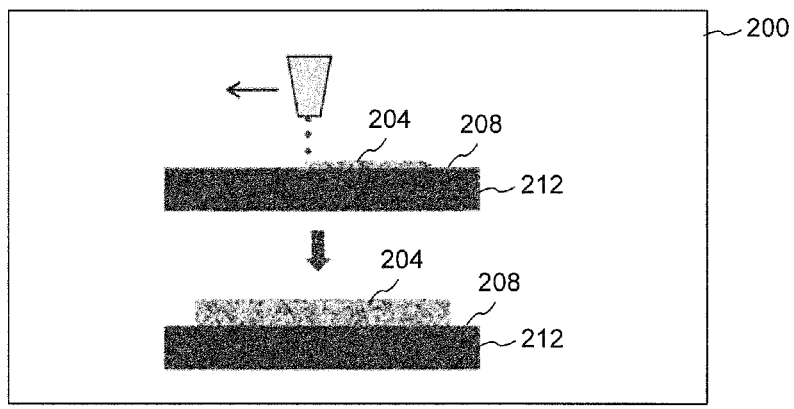
FIGS. 2A to 2F show a method for attaching a metal surface to a carrier according to an embodiment.

FIGS. 2A to 2F show illustrations for performing method 100 according to various embodiments. FIG. 2A shows illustration 200 of the method including:

depositing porous layer 204 over metal surface 208 of structure 212 according to an embodiment. Porous layer 204 may have a thickness ranging from about 1 μm to about 150 μm, e.g. about 5 μm to about 60 μm.

Figure 2B:
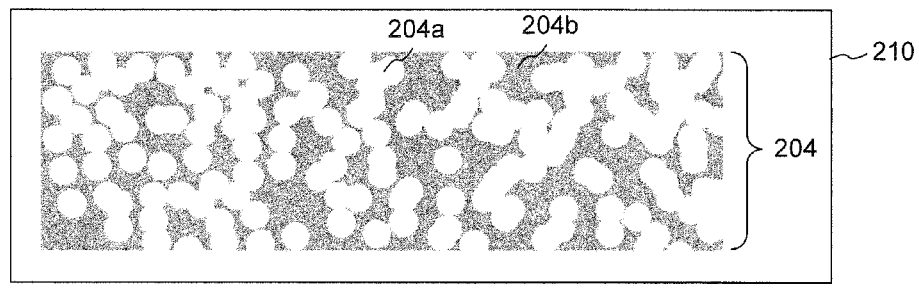

FIG. 2B shows illustration 210 of porous layer 204. Porous layer 204 may be deposited by depositing particles 204b over metal surface 208, thereby forming pores 204a of porous layer 204. Pores 204a may have a pore size larger than about 50 nm. Techniques for depositing particles 204b including a cold spraying process and a cold plasma process, e.g. using such as "Plasma dust" technology by Reinhausen plasma.

Particles 204b may have diameters ranging from about 200 nm to 40 μm, e.g. about 500 nm to about 30 μm, e.g. about 800 nm to about 10 μm. Particles 204b may include at least one of the following group of materials: an isolation material, an electrically conductive material, a thermally conductive material, a metal, e.g. copper, nickel, silver, palladium and gold, and a ceramic. Particles 204b formed from ceramic material may include particles 204b formed from at least one of the following group of materials: calcium oxide CaO, aluminum oxide $Al_2O_3$, silicon oxide $SiO_2$, aluminum nitride AlN, and zirconium oxide $ZrO_2$.

According to an embodiment, method 100 may further include:

heating particles 204b after depositing particles 204b over metal surface 208, to cause at least one of the following: sintering of particles 204b with each other, and adherence of particles 204b to metal surface 208. When copper particles 204b are deposited over metal surface 208, particles 204b may be heated up to temperatures in the range of about 70° C. to about 130° C. to cause sintering of copper particles 204b. When particles 204b including ceramics and metals not including copper are deposited over metal surface 208, particles 204b may be heated between the range of about 20° C. to about 150° C. to cause sintering of particles 204b. The maximum temperature may be controlled to reduce oxidation of the surface 208 of structure 212. The maximum processing temperature applied according to the embodiments, lies significantly lower than those used for current solder treatments.

Particles 204b over surface 208, e.g. metal surface 208, may be heated to cause partial melting of surface 208, e.g. metal surface 208, with particles 204b. An intermetallic phase between surface 208, e.g. metal surface 208, and particles 204b, may be formed. When surface 208, e.g. metal surface 208, of structure 212 is rough, particles 204b may penetrate the molecular layer of surface 208, e.g. metal surface 208, of structure 212.

Figure 2C:
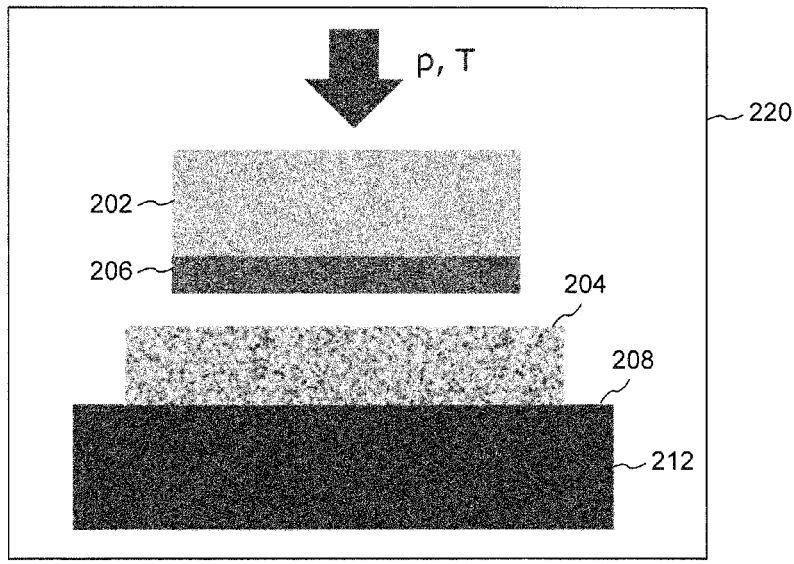

FIG. 2C shows illustration 220 in which material 206, may be formed over a side or over a surface of carrier 202. Material 206 may be deposited by spin-coating. According to an alternate embodiment, instead of forming porous layer 204 over metal surface 208 of structure 212, porous layer 204 may be formed over a side or over a surface of carrier 202. Instead of forming material 206 over a side or over a surface of carrier 202, material 206 may be formed over metal surface 208. Method 100 may then be carried out as described according to FIGS. 1 and 2.

Figure 2D:
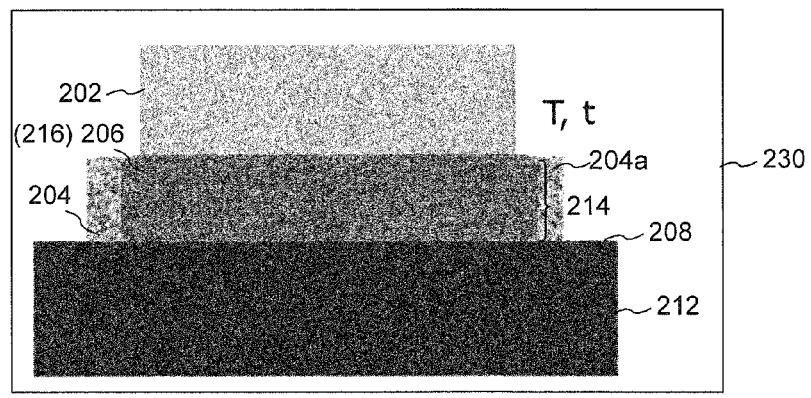

FIG. 2D shows illustration 230 of attaching metal surface 208 to porous layer 204 by bringing material 206 into pores 204a of porous layer 204, resulting in material 206 forming interconnection 216, e.g. an adhesive, between metal surface 208 and carrier 202. Carrier 202 may include at least one from the following group of materials: a metal, ceramic or plastic.

Material 206 may include at least one of: a polymer material; an organic material; a thermosetting material, e.g. duroplast, a resin; epoxide; polyimide (dissolved and/or undissolved); silicone; and acrylate.

According to an embodiment, material 206 may be a non-adhesive material. That is, material 206 may not be able to achieve a reliable adhesive connection when used without porous layer 204 and/or individually as an adhesive paste.

FIG. 2D further shows that bringing material 206 into pores 204a of porous layer 204 may include flowing material 206 within pores 204a of porous layer 204 and providing adhesion of porous layer 204 to metal surface 208 and carrier 202 in a common process as illustrated in illustration 230.

Deposited porous layer 204 may be a sponge-like and brittle. Pores 204a of porous layer 204 may be filled with material 206, which may form a composite material 214 together with brittle porous layer 204. The size of particles of material 206 may be smaller than the size of pores 204a in porous material 204.

Porous layer 204 may have a tendency to be sponge-like, soaking in material 206, by existing capillary forces. Material 206 may be anchored firmly in pores 204a and may only be removed with difficulty. Depending on the choice of material 206, different mechanical properties of composite material 214 may be obtained.

Bringing material 206 into pores 204a of porous layer 204 may include enhancing the wettability of porous layer 204 with metal surface 208 and carrier 202. Particles 204b and material 206 may form adhesive composite material 214.

Figure 2E:
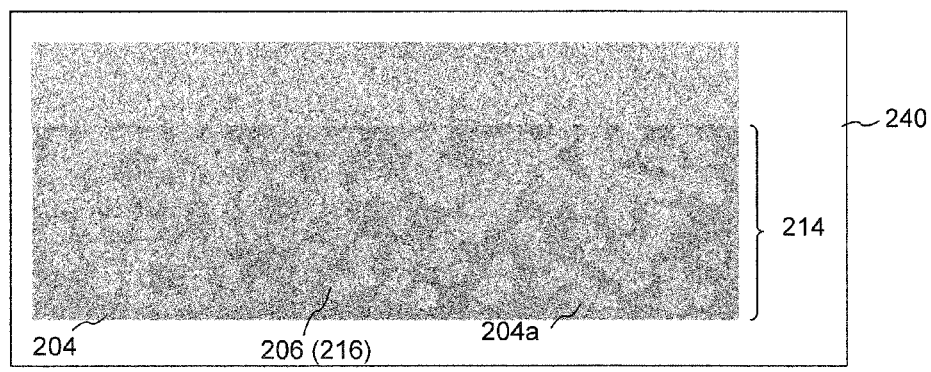

FIG. 2E shows illustration 240 of composite material 214 according to an embodiment, wherein material 206 has be allowed to flow within pores 204a of porous layer 204 forming interconnection 216, e.g. an adhesive.

Figure 2F:
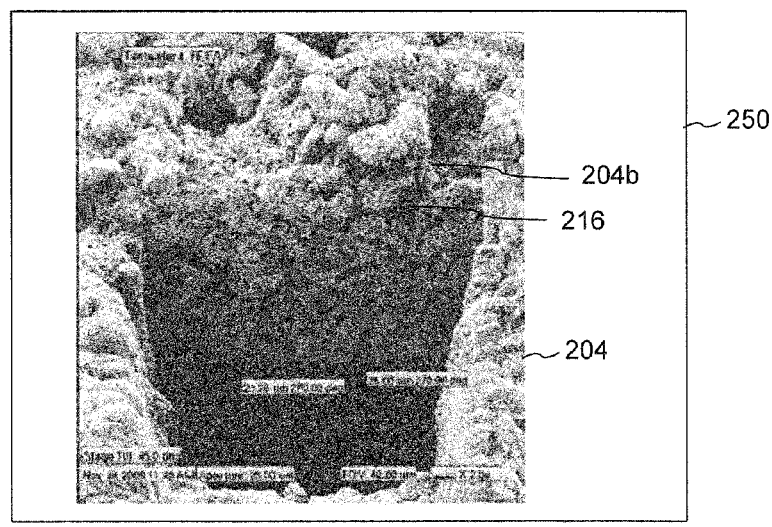

FIG. 2F shows scanning electron microscopy image 250 of copper particles 204b forming a copper porous layer 204 approximately 40 μm thick, according to an embodiment.

Bringing material 206, which may be a non-adhesive material into pores 204a of porous layer 204, may result in material 206 forming an interconnection 216, e.g. an adhesive, between metal surface 208 and carrier 202.

Method 100 may further include thermally curing interconnection 216 to secure interconnection 216 within porous layer 204 and to secure metal surface 208 to carrier 202. Thermally curing interconnection 216 may occur in the range of between about 50° C. and about 250° C., e.g. between about 100° C. and about 200° C., between about 125° C. and about 175° C., which is a lower temperature than standard solder temperatures which may be used for soldering a conductive adhesive. Furthermore, very high thermal conductivity, e.g. higher than 10 W/(m·K), and electrical conductivity, e.g. higher than $10^6$ S/m, may be obtained. Composite material 214 may eliminate the need for standard solder materials, and may be used as an adhesive, e.g. a thermally conductive adhesive, or electrically conductive adhesive in fields such as power electronics. Composite material 214 may be applied to a chip back-side, and/or form part of a source/gate/drain contact.

The properties of the resulting composite material 214, e.g. elasticity, adhesion to metal surface 208, or susceptibility to corrosion, may be achieved by varying the selection of material 206 used.

According to an embodiment, structure 212 may include a semiconductor chip. Metal surface 208 may include a source, drain or gate contact pad. Carrier 202 may include at least one of a printed circuit board, lead frame and semiconductor wafer.

The basic functionalities of the features described with respect to FIGS. 1 and 2A to 2F will be referred to and are applicable throughout all the various embodiments which will be described in more detail below. Identical features as to those described in FIG. 2 are denoted with the same reference signs.

Figure 3:
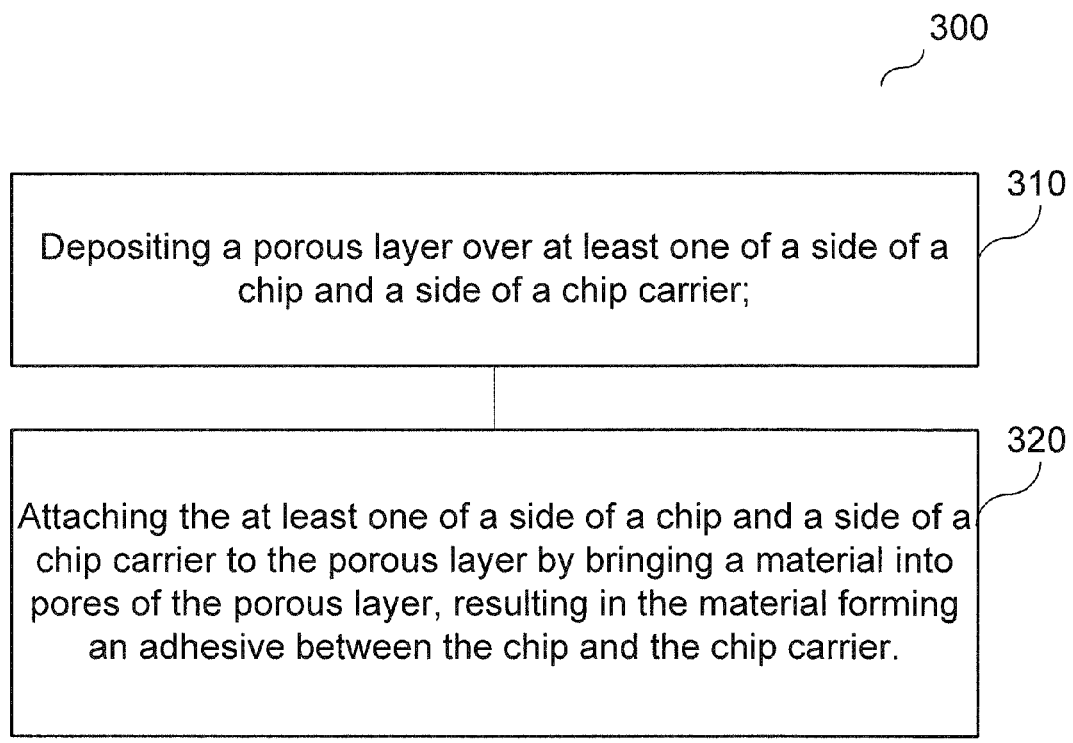
FIG. 3 shows a method for attaching a chip to a chip carrier according to an embodiment.
Figure 4A:
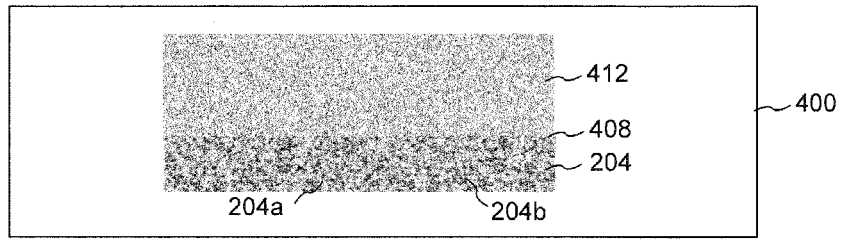
FIGS. 4A to 4J show a method for attaching a chip to a chip carrier according to various embodiments.
Figure 4B:
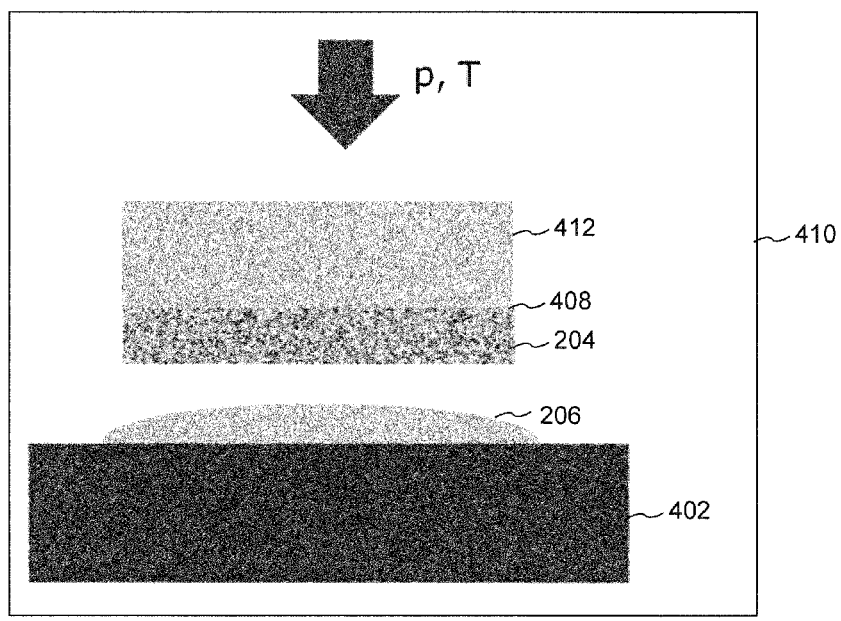
Figure 4C:
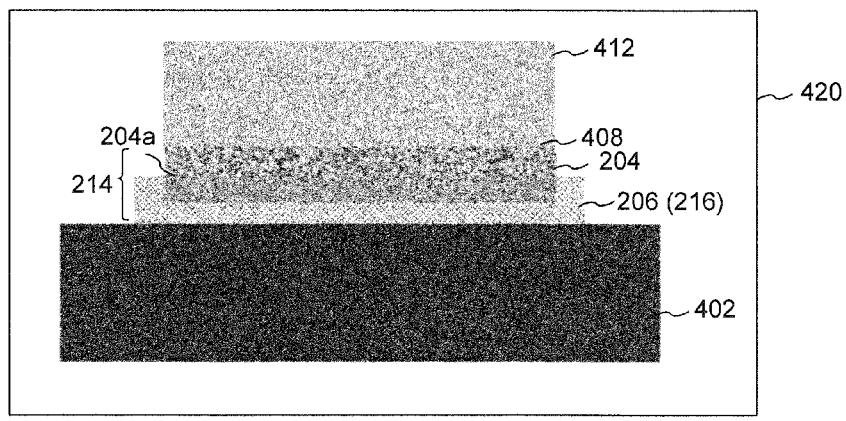

FIG. 3 shows method 300 for attaching a chip to a chip carrier according to an embodiment. FIGS. 4A to 4C show illustrations for performing a method 300 according to various embodiments. Method 300 may include the steps and features according to method 100, already described with respect to FIGS. 1 and 2. Method 300 may include:

depositing a porous layer over at least one of a side of a chip and a side of a chip carrier (in 310);

attaching the at least one of a side of a chip and a side of a chip carrier to the porous layer by bringing a material into pores of the porous layer, resulting in the material forming an interconnection, e.g. forming an adhesive, between the chip and the chip carrier (in 320).

FIG. 4A shows illustration 400 of depositing porous layer 204 over a side 408 of chip 412 according to an embodiment.

Porous layer 204 may be deposited by depositing particles 204b over a side 408 of a chip 412, thereby forming pores 204a of porous layer 204. Side 408 of chip 412 may include a surface 208, e.g. a metal surface 208 as described with respect to FIGS. 1 and 2.

FIG. 4B shows illustration 410, wherein side 408 of chip 412 may be attached to porous layer 204. According to an embodiment, material 206 may be formed over a side or over a surface of chip carrier 402.

FIG. 4C shows illustration 420, wherein side 408 of chip 412 may be attached to porous layer 204 by bringing a material 206 into pores 204a of porous layer 204, resulting in material 206 forming an interconnection 216, e.g. forming an adhesive, between side of chip 412 and chip carrier 402. Chip carrier 402 may include at least one from the following group of materials: a metal, ceramic or plastic. Chip carrier 402 may include at least one of: a printed circuit board, a further chip, a semiconductor wafer, and a leadframe.

Figure 4D:
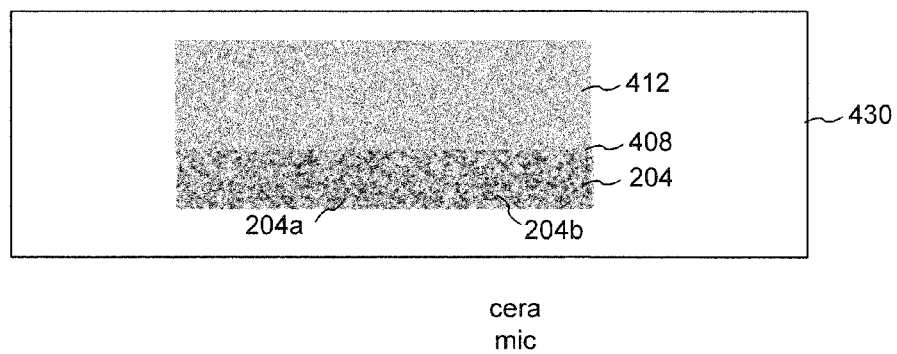

FIG. 4D shows illustration 430 of depositing porous layer 204 over a side 408 of chip 412 according to an embodiment wherein porous layer 204 includes a ceramic material.

Figure 4E:
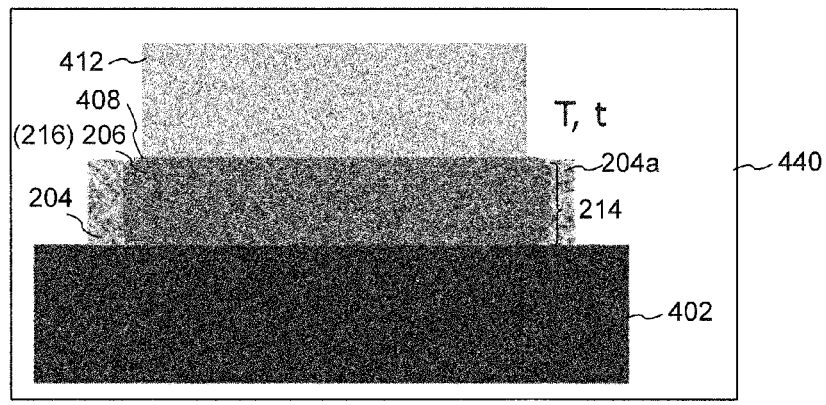

FIG. 4E shows illustration 440 of attaching side 408 of chip 412 to ceramic porous layer 204 by bringing material 206 into pores 204a of ceramic porous layer 204, resulting in material 206 forming interconnection 216, e.g. an adhesive, between side 408 of chip 412 and chip carrier 402, such that after a temperature process is performed on material 206 a stable and highly thermally conductive interconnection 216, e.g. an adhesive, is formed between side 408 of chip 412 and chip carrier 402.

Figure 4F:
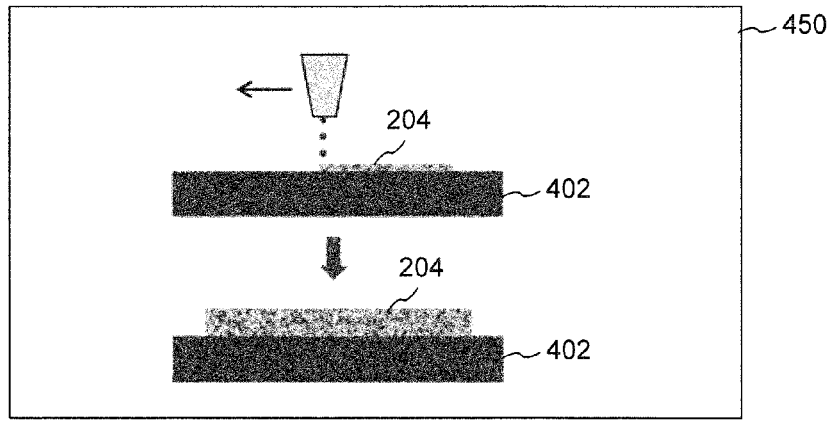

According to an alternate embodiment, instead of forming porous layer 204 over side 408 of chip 412, porous layer 204 may be formed over a side or over a surface of a carrier 402 as shown in illustration 450 of FIG. 4F. Instead of forming material 206 over a side or over a surface of a carrier 402, material 206 may be formed over side 408 of chip 412. Side 408 of chip 412 may include a chip back-side. Method 300 may then be carried out as described according to FIGS. 3 and 4A to 4E.

FIG. 4F shows illustration 450 of depositing porous layer 204 over chip carrier 402 according to an embodiment wherein porous layer 204 includes a copper.

Figure 4G:
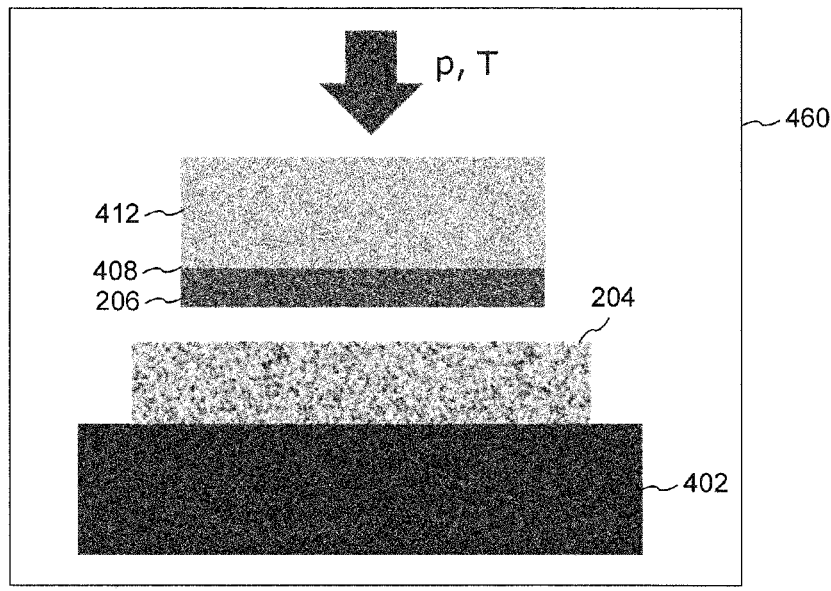

FIG. 4G shows illustration 460 wherein material 206 may be formed over a side 408 of chip 412.

Figure 4H:
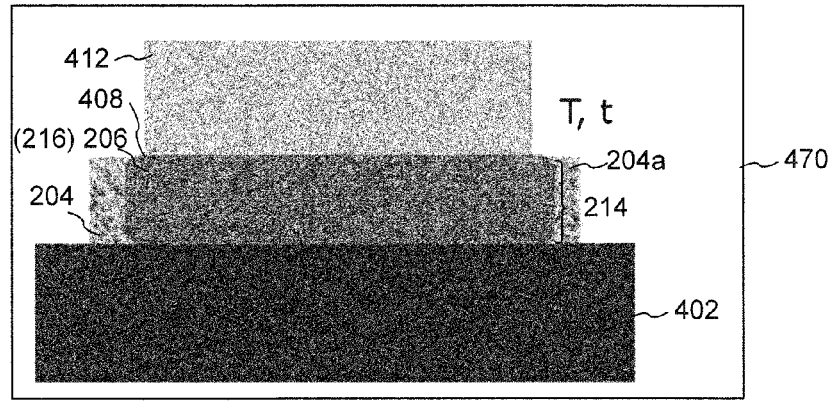

FIG. 4H shows illustration 470 of attaching carrier 402 to porous layer 204 by bringing material 206 into pores 204a of porous layer 204, resulting in material 206 forming interconnection 216, e.g. an adhesive, between side 408 of chip 412 and chip carrier 402. Porous layer 204 may include a porous particle layer formed from copper. After a temperature process is performed on material 206 a stable and highly electrically and thermally conductive interconnection 216, e.g. an adhesive, is formed between side 408 of chip 412 and chip carrier 402.

Figure 4I:
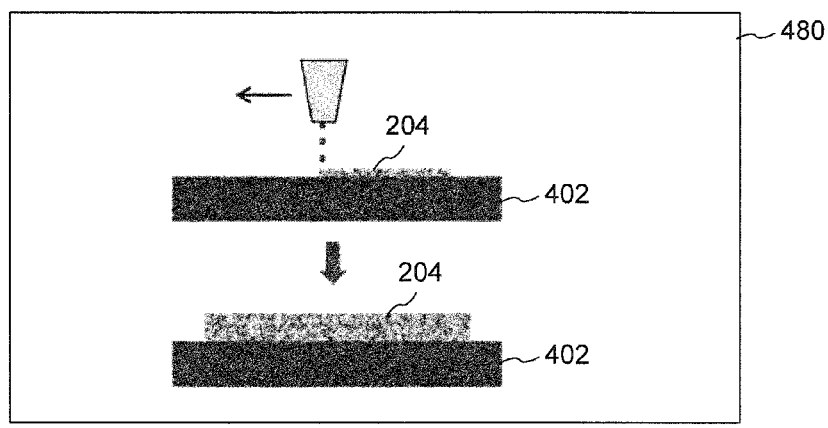
Figure 4J:
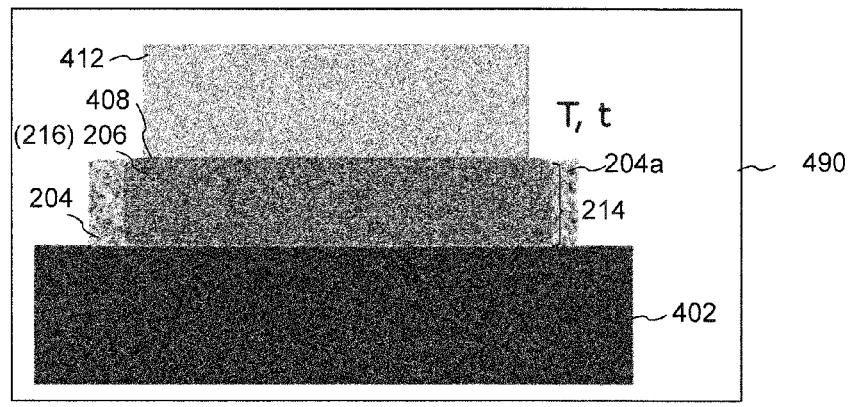

FIG. 4I shows illustration 480 according to an embodiment, wherein porous layer 204 may be deposited over chip carrier 402 wherein porous layer 204 includes a ceramic. FIG. 4J shows illustration 480 of attaching carrier 402 to porous layer 204 by bringing material 206 into pores 204a of porous layer 204, resulting in material 206 forming interconnection 216, e.g. an adhesive, between side 408 of chip 412 and chip carrier 402. After a temperature process is performed on material 206, a stable and highly thermally conductive connection interconnection 216, e.g. an adhesive, is formed between side 408 of chip 412 and chip carrier 402.

The basic functionalities of the features described with respect to FIGS. 3 and 4 will be referred to and are applicable throughout all the various embodiments which will be described in more detail below. Identical features as to those described in FIGS. 4A to 4J are denoted with the same reference signs. The temperature process referred to with respect to FIGS. 4A to 4J may include the functionalities and features of the temperature process described with respect to FIGS. 5A to 5F below.

FIGS. 5A to 5F show illustrations of a method for attaching a chip 412 to a further structure 518 according to an embodiment.

Figure 5A:
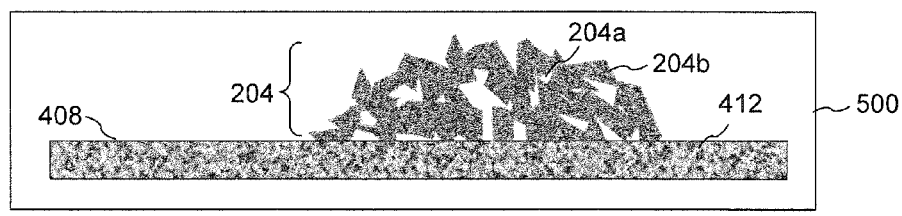
FIGS. 5A to 5F show a method for attaching a chip to a further structure according to an embodiment.

FIG. 5A shows illustration 500 of depositing a porous layer 204 over a side 408 of a chip 412. Porous layer 204 may be deposited by depositing particles 204b over side 408 of chip 412, thereby forming pores 204a of porous layer 204. Particles 204b may be sintered over the side of a chip 412, causing particles 204b to sinter with each other, and to adhere particles 204b to side 408 of chip 412.

Figure 5B:
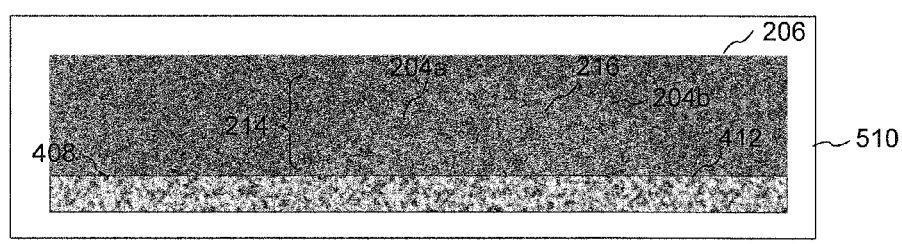

FIG. 5B shows illustration 510, wherein material 206 may be brought into pores 204a of porous layer 204 over chip 412. Material 206 may be deposited over porous layer 204 and/or chip 412, e.g. by spin-coating. Material 206 may be a low-viscosity material which may penetrate porous layer 204, material 206 and porous layer 204 together forming a composite material 214.

Figure 5C:
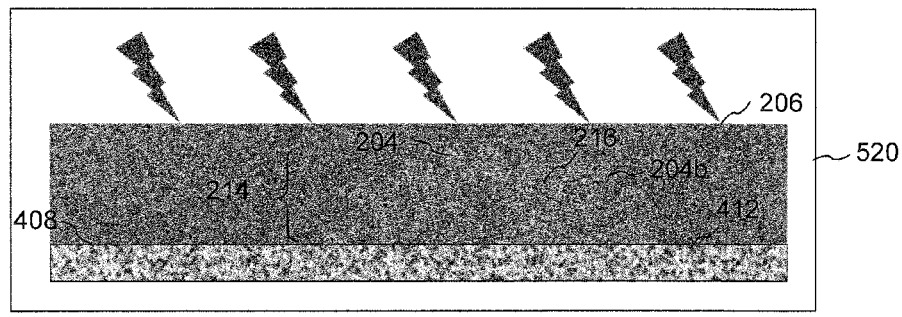

FIG. 5C shows illustration 520, wherein side 408 of chip 412 over which porous layer 204 and material 206 were deposited may be subjected to a treatment or development, e.g. a thermal process, or ultra violet radiation. Treatment may be used to strengthen adhesion of a part of material 206 within pores 204a and may be used to ease the removal of a part of material 206, e.g. parts of material 206 not within pores 204a, which may be fully exposed to treatment.

Figure 5D:
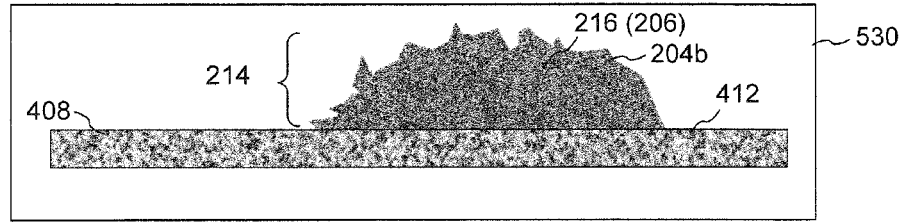

FIG. 5D shows illustration 530, wherein a part of material 206 may be removed, e.g. removed by washing. Part of material 206, which may not have entered porous layer 204, may be removed easily due to more exposure to the treatment. Material 206 within porous layer 204 may remain within porous layer 204 due to insufficient exposure of material 206 within porous layer 204 and high interaction forces of material 206 with particles 204b of porous layer 204. Even without the treatment described with respect to FIG. 5C, material 206 may remain within pores 204a of porous layer 204 due to strong cohesive forces, e.g. capillary forces, due to interaction with particles 204b in composite material 214.

The process steps described with respect to FIGS. 5A to 5D may be repeated with respect to a further structure 518, wherein further structure 518 may include at least one of a further chip 412, and a chip carrier 402. Therefore, porous layer 204 and material 206 may be deposited over further structure 518 according to the method described according to FIGS. 5A to 5D.

Figure 5E:
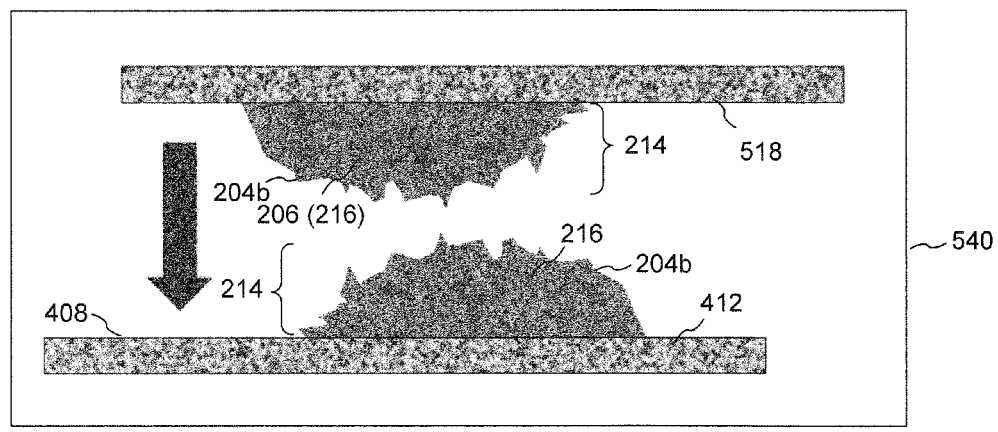

FIG. 5E shows illustration 540, wherein chip 412 and further structure 518 may be brought together, e.g. joined together, such that composite material 214 formed over side 408 of chip 412 and composite material 214 formed over a side of further structure 518 may be contacted to each other.

Figure 5F:
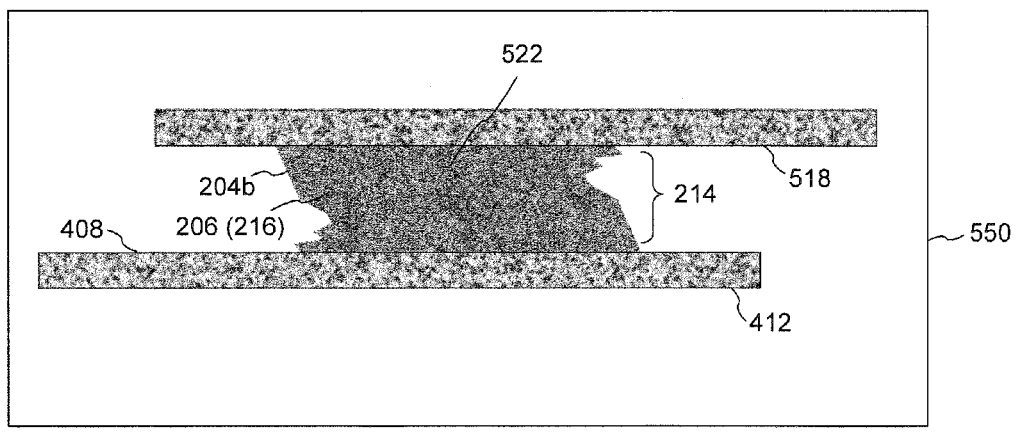

Suitable process parameters, e.g. pressure, temperature, ultrasound, may be used to form joint 522 between chip 412 and further structure 518, as shown in FIG. 5F, and to reinforce material 206 as an interconnection 216, e.g. an adhesive material. Material 206 may include a polymer, which may include a bi-stage material i.e. material 206 softens at elevated temperatures. A temperature process involving bi-stage material 206 may include heating material 206 to an elevated temperature for a certain period of time, such that material 206 changes its wetting behavior during the process. Changes to the wettability of material 206 may include material 206 having a greater affinity or wettability with porous layer 204, therefore causing material 206 to behave like an interconnection 216, e.g. an adhesive. A pressure process may include applying pressure to the joint 522 of composite material 214 formed over side 408 of chip 412 and composite material 214 formed over a side of further structure 518, for a certain period of time. The applied pressure may increase the flow of material 206 within pores 204a of porous layer 204, and therefore increase the surface area of material 206 in contact with pores 204a of porous layer 204, therefore increasing and improving the adhesion between chip 412 and further structure 518.

According to an embodiment, chip 412 and further structure 518 may each include a part of a semiconductor wafer. According to an embodiment, particles 204b formed over each of chip 412 and further structure 518 may include copper metallic particles. According to an embodiment, composite material 214 formed over each of chip 412 and further structure 518 may include at least part of a pad, e.g. a bond pad, a metallic pad or a conductive pad. Further structure 518, may include at least one from the following group of materials: a metal, ceramic or plastic. Further structure 518, may include at least one of: a printed circuit board, a further chip, and a leadframe.

According to an embodiment, composite material 214 as described with respect to FIGS. 1 to 5 may include metal particles 204b, e.g. Cu, Ni, Ag, and also simple alloys, of porous layer 204. When composite material 214 is electrically conductive, composite material 214 may be used as an underbump metallization for chip 412, which may include a flip chip in a wafer level package. Conductive composite material 214 may be used as a replacement for current underbump metallization layers which when subject to cycles of high power and high voltage of printed circuit boards, are therefore prone to cracks and damage. Reliability of current underbump metallization layers could therefore be improved by using a more flexible underbump metallization formed from composite material 214.

The material of interconnection 216 at the interfaces, e.g. within pores 204a of porous layer 204 greatly improves the adhesion of the porous layer 204, to a surface and/or a side, as real wetting takes place. Furthermore, the electrical properties of composite material 214 are not reduced, since the electrical conductor paths may be obtained by conductive particles 204b situated in porous layer 204.

Due to the improved adhesion of material 206 to porous layer 204b, the susceptibility of composite material 214 to corrosion is greatly reduced. The electrical properties of composite material 214 may be adapted or varied by using particles 204b with defined properties, e.g. electrical properties and dielectric behavior. The use of porous layers, e.g. porous materials 204 may furthermore suppress eddy current losses. Material 206 may be adapted and adhesive properties of interconnection 216 may be obtained by cross-linking material 206 with additives and thermoplastic materials.

The basic functionalities of the features described with respect to FIGS. 5A to 5F will be referred to and are applicable throughout all the various embodiments which will be described in more detail below. Identical features as to those described in FIGS. 5A to 5F are denoted with the same reference signs.

Figure 6:
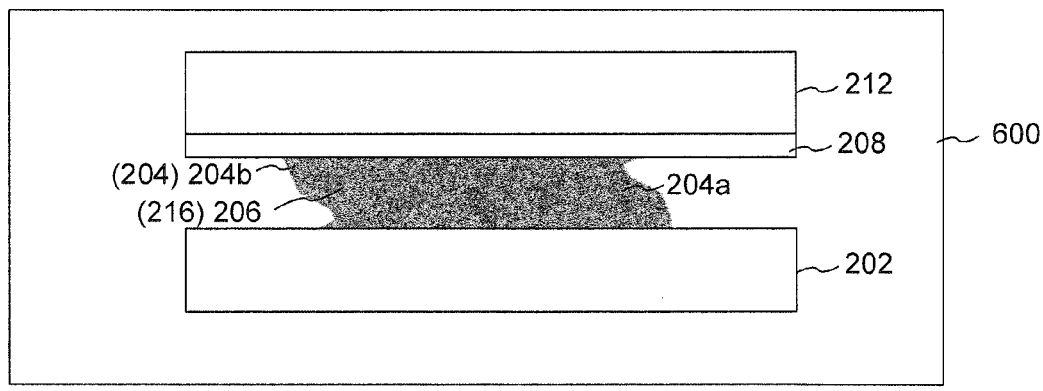
FIG. 6 shows an illustration of a packaging module according to an embodiment.

FIG. 6 shows an illustration of a packaging module 600 according to an embodiment. The packaging module 600 may include a structure 212 including at least one surface 208, e.g. a metal surface 208, a carrier 202, particles 204b of at least one material configured to form a porous layer 204 between the surface 208, e.g. a metal surface 208 of the structure 212 and the carrier 202, and at least one further material 206 within the pores 204a of the porous layer 204 configured to adhere surface 208, e.g. metal surface 208, of structure 212 to the carrier 202. The porous layer 204 may be formed over at least one of the metal surface 208 or a surface of the carrier 202.

Figure 7:
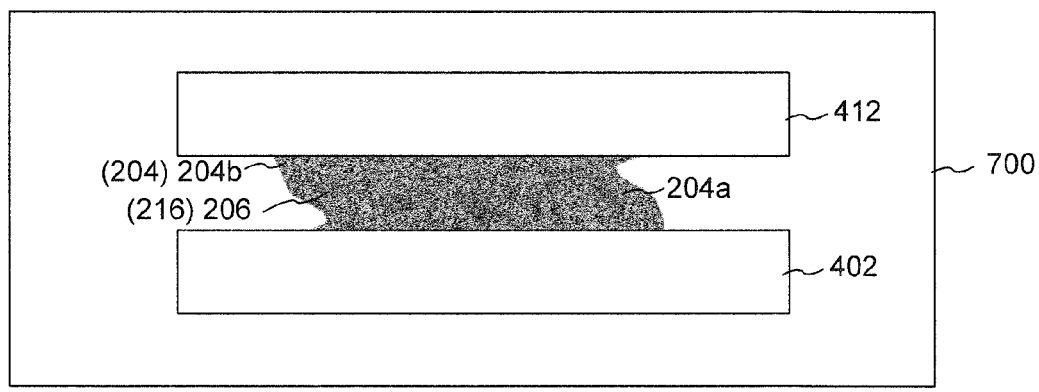
FIG. 7 shows an illustration of a chip packaging module according to an embodiment.

FIG. 7 shows an illustration of a chip packaging module 700 according to an embodiment. The chip packaging module 700 may include a chip 412 and a chip carrier 402, particles 204b of at least one material configured to form a porous layer 204 between the chip 412 and the chip carrier 402, and at least one further material 206 within the pores 204a of the porous layer 204 configured to adhere the chip 412 to the chip carrier 402. 22. Porous layer 204 may be formed over at least part of at least one of a surface of the chip 412 and a surface of the chip carrier 402. The porous layer 204 may form at least part of at least one of a surface of the chip 412 and a surface of the chip carrier 402.

The above embodiments disclose a stable and reliable adhesive connection between two structures, e.g. between chip 412 and chip carrier 402, and metal surface 208 and carrier 202. Depending on choice of particles 204b, excellent heat dissipation qualities from the chip may be obtained. In the case wherein particles 204b are formed from ceramic materials, excellent heat dissipation and electrical isolation may be achieved. In the case wherein particles 204b are formed from a metal, such as copper, excellent heat dissipation and electrical conductivity may be achieved. The flow of material 206 in pores 204a provides a stable adhesive connection due at least to the mechanical entanglement of material 206 with porous layer 204. The materials used are generally low-cost materials. According to various embodiments, problems related to the overflowing of standard adhesive glues or pastes over a chip side may be circumvented. The risk of standard adhesive glues or pastes causing short-circuiting on a chip may be thereby reduced, with minimal risk of flow out of adhesive glues and pastes onto chip carrier 202.

A method for attaching a metal surface to a carrier according to an embodiment is disclosed, the method including: depositing a porous layer over at least one of a metal surface and a side of a carrier; and attaching the at least one of a metal surface and a side of a carrier to the porous layer by bringing a material into pores of the porous layer, resulting in the material forming an interconnection between the metal surface and the carrier.

According to an embodiment, depositing a porous layer over the at least one of a metal surface and a side of a carrier includes depositing a porous layer having a thickness ranging from about 1 μm to 150 μm.

According to an embodiment, depositing a porous layer over the at least one of a metal surface and a side of a carrier includes depositing particles over the at least one of a metal surface and a side of a carrier, thereby forming pores of the porous layer.

According to an embodiment, forming pores of the porous layer includes forming pores which are larger than about 50 nm.

According to an embodiment, depositing particles over the at least one of a metal surface and a side of a carrier includes depositing particles by means of a cold spraying process.

According to an embodiment, depositing particles over the at least one of a metal surface and a side of a carrier includes depositing particles by means of a cold plasma process.

According to an embodiment, depositing particles over the at least one of a metal surface and a side of a carrier includes depositing particles having diameters ranging from about 200 nm to 40 μm.

According to an embodiment, depositing particles over the at least one of a metal surface and a side of a carrier includes depositing particles including an isolation material.

According to an embodiment, depositing particles over the at least one of a metal surface and a side of a carrier includes depositing particles including an electrically conductive material.

According to an embodiment, depositing particles over the at least one of a metal surface and a side of a carrier includes depositing particles including a thermally conductive material.

According to an embodiment, depositing particles over the at least one of a metal surface and a side of a carrier includes depositing particles including a metal.

According to an embodiment, depositing particles over the at least one of a metal surface and a side of a carrier includes depositing particles including a ceramic.

According to an embodiment, depositing particles over the at least one of a metal surface and a side of a carrier includes depositing particles including at least one from the following group of materials: copper, nickel, silver, palladium or gold.

According to an embodiment, heating the particles after depositing particles over the at least one of a metal surface and a side of a carrier, to cause at least one of the following: sintering of the particles with each other, and adherence of the particles to the at least one of a metal surface and a side of a carrier.

According to an embodiment, attaching the at least one of a metal surface and a side of a carrier to the porous layer by bringing a material into the pores of the porous layer includes attaching the at least one of a metal surface and a side of a carrier to the porous layer by bringing a material including a polymer material into the pores of the porous layer.

According to an embodiment, attaching the at least one of a metal surface and a side of a carrier to the porous layer by bringing a material into the pores of the porous layer includes attaching the at least one of a metal surface and a side of a carrier to the porous layer by bringing a material including an organic material into the pores of the porous layer.

According to an embodiment, attaching the at least one of a metal surface and a side of a carrier to the porous layer by bringing a material into the pores of the porous layer includes attaching the at least one of a metal surface and a side of a carrier to the porous layer by bringing a material including a thermosetting material into the pores of the porous layer.

According to an embodiment, attaching the at least one of a metal surface and a side of a carrier to the porous layer by bringing a material into the pores of the porous layer includes attaching the at least one of a metal surface and a side of a carrier to the porous layer by bringing a material including at least one from the following group of materials: epoxide, polyimide (dissolved and/or undissolved), silicone or acrylate, into the pores of the porous layer According to an embodiment, attaching the at least one of a metal surface and a side of a carrier to the porous layer by bringing a material into the pores of the porous layer includes attaching the at least one of a metal surface and a side of a carrier to the porous layer by bringing a material including a non-adhesive material into the pores of the porous layer.

According to an embodiment, bringing a material into the pores of the porous layer includes flowing the material within the pores of the porous layer and providing adhesion of the porous layer to the metal surface and the carrier in a common process.

According to an embodiment, bringing a material into the pores of the porous layer includes enhancing the wettability of the porous layer with the metal surface and the carrier.

According to an embodiment, the method may further include: thermally curing the interconnection to secure the interconnection within the porous layer and to secure the metal surface to the carrier.

According to an embodiment, thermally curing the interconnection occurs between 50° C. and 250° C., e.g. between 100° C. and 200° C.

According to an embodiment, forming an interconnection, between the metal surface and the carrier includes forming an interconnection between the metal surface and the carrier including at least one from the following group of materials: a metal, ceramic or plastic.

A method for attaching a chip to a chip carrier according to an embodiment is disclosed, the method including: depositing a porous layer over at least one of a side of a chip and a side of a chip carrier; and attaching the at least one of a side of a chip and a side of a chip carrier to the porous layer by bringing a material into pores of the porous layer, resulting in the material forming an interconnection between the chip and the chip carrier.

According to an embodiment, depositing a porous layer over the at least one of a side of a chip and a side of a chip carrier includes depositing a porous layer having a thickness ranging from about 1 μm to 150 μm.

According to an embodiment, depositing a porous layer over the at least one of a side of a chip and a side of a chip carrier includes depositing particles over the at least one of a side of a chip and a side of a chip carrier hence forming pores of the porous layer.

According to an embodiment, forming pores of the porous layer includes forming pores which are larger than about 50 nm.

According to an embodiment, depositing particles over the at least one of a side of a chip and a side of a chip carrier includes depositing particles by means of a cold spraying process.

According to an embodiment, depositing particles over the at least one of a side of a chip and a side of a chip carrier includes depositing particles by means of a cold plasma process.

According to an embodiment, depositing particles over the at least one of a side of a chip and a side of a chip carrier includes depositing particles having diameters ranging from about 200 nm to 40 µm.

According to an embodiment, depositing particles over the at least one of a side of a chip and a side of a chip carrier includes depositing particles including an isolation material.

According to an embodiment, depositing particles over the at least one of a side of a chip and a side of a chip carrier includes depositing particles including an electrically conductive material.

According to an embodiment, depositing particles over the at least one of a side of a chip and a side of a chip carrier includes depositing particles including a thermally conductive material.

According to an embodiment, depositing particles over the at least one of a side of a chip and a side of a chip carrier includes depositing particles including a metal.

According to an embodiment, depositing particles over the at least one of a side of a chip and a side of a chip carrier includes depositing particles including a ceramic.

According to an embodiment, depositing particles on the at least one of a side of a chip and a side of a chip carrier includes depositing particles including at least one from the following group of materials: copper, nickel, silver, palladium or gold.

According to an embodiment, the method may further include: heating the particles after depositing particles over the at least one of a side of a chip and a side of a chip carrier to cause at least one of the following: sintering of the particles with each other, and adherence of the particles to the at least one of the side of a chip, and the side of a chip carrier.

According to an embodiment, attaching the at least one of a side of a chip and a side of a chip carrier to the porous layer by bringing a material into the pores of the porous layer includes attaching the at least one of a side of a chip and a side of a chip carrier to the porous layer by bringing a material including a polymer material into the pores of the porous layer.

According to an embodiment, attaching the at least one of a side of a chip and a side of a chip carrier to the porous layer by bringing a material into the pores of the porous layer includes attaching the at least one of a side of a chip and a side of a chip carrier to the porous layer by bringing a material including an organic material into the pores of the porous layer.

According to an embodiment, attaching the at least one of a side of a chip and a side of a chip carrier to the porous layer by bringing a material into the pores of the porous layer includes attaching the at least one of a side of a chip and a side of a chip carrier to the porous layer by bringing a material including a thermosetting material into the pores of the porous layer.

According to an embodiment, attaching the at least one of a side of a chip and a side of a chip carrier to the porous layer by bringing a material into the pores of the porous layer includes attaching the at least one of a side of a chip and a side of a chip carrier to the porous layer by bringing a material including at least one from the following group of materials: epoxide, polyimide (dissolved and/or undissolved), silicone or acrylate, into the pores of the porous layer According to an embodiment, attaching the at least one of a side of a chip and a side of a chip carrier to the porous layer by bringing a material into the pores of the porous layer includes attaching the at least one of a side of a chip and a side of a chip carrier to the porous layer by bringing a material including a non-adhesive material into the pores of the porous layer.

According to an embodiment, bringing a material into the pores of the porous layer includes flowing the material within the pores of the porous layer and providing adhesion of the porous layer to the chip and the chip carrier in a common process.

According to an embodiment, bringing a material into the pores of the porous layer includes enhancing the wettability of the porous layer with the chip and the chip carrier.

According to an embodiment, the method may further include thermally curing the interconnection to secure the interconnection within the porous layer and to secure the chip to the chip carrier.

According to an embodiment, thermally curing the interconnection occurs between 70° C. and 150° C.

According to an embodiment, forming an interconnection between the chip and a chip carrier includes forming an interconnection between the chip and a chip carrier including a printed circuit board.

According to an embodiment, forming an interconnection between the chip and a chip carrier includes forming an interconnection between the chip and a chip carrier including a further chip.

According to an embodiment, forming an interconnection between the chip and a chip carrier includes forming an interconnection between the chip and a chip carrier including a semiconductor wafer.

According to an embodiment, forming an interconnection between the chip and a chip carrier includes forming an interconnection between the chip and a chip carrier including a leadframe.

According to an embodiment, forming an interconnection between the chip and a chip carrier includes forming an interconnection between the chip and a chip carrier including at least one from the following group of materials: a metal, ceramic or plastic.

A chip-packaging module according to an embodiment is disclosed, the chip-packaging module including: a chip and a chip carrier; particles of at least one material configured to form a porous layer between the chip and the chip carrier, and at least one further material within the pores of the porous layer configured to adhere the chip to the chip carrier.

According to an embodiment, the porous layer is formed over at least part of at least one of a surface of the chip and a surface of the chip carrier.

According to an embodiment, the porous layer forms at least part of at least one of a surface of the chip and a surface of the chip carrier.

According to an embodiment, the porous layer has a thickness ranging from about 1 µm to 150 µm.

According to an embodiment, the particles of the at least one material have diameters ranging from approximately 200 nm to 40 µm.

According to an embodiment, the particles of the at least one material are powder particles.

According to an embodiment, the particles are configured to form pores of the porous layer, wherein the size of the pores is larger than approximately 50 nm.

According to an embodiment, the at least one material is an isolation material.

According to an embodiment, the at least one material is an electrically conductive material.

According to an embodiment, the at least one material is a thermally conductive material.

According to an embodiment, the at least one material is a metal.

According to an embodiment, the at least one material is a ceramic.

According to an embodiment, the at least one material includes at least one of a group consisting of: copper, nickel, silver, palladium or gold.

According to an embodiment, the at least one material is configured to suppress eddy current losses.

According to an embodiment, the at least one further material includes a polymer.

According to an embodiment, the at least one further material includes an organic material.

According to an embodiment, the at least one further material includes a thermosetting material.

According to an embodiment, the at least one further material is a low viscosity material.

According to an embodiment, the at least one further material includes at least one of the following group of materials: epoxide, polyimide (dissolved and/or undissolved), silicone or acrylate.

According to an embodiment, the at least one further material is a non-adhesive material.

According to an embodiment, the at least one further material is configured to provide adhesion of the porous layer to the chip and the chip carrier due to the flow of the at least one further material within the pores of the porous layer.

According to an embodiment, the at least one further material is configured to enhance the wettability of the porous layer with the chip and the chip carrier.

According to an embodiment, the chip carrier includes a printed circuit board.

According to an embodiment, the chip carrier includes a further chip.

According to an embodiment, the chip carrier includes a semiconductor wafer.

According to an embodiment, the chip carrier includes a leadframe.

A packaging module according to an embodiment is disclosed, the packaging module including: a structure including at least one metal surface; a carrier; particles of at least one material configured to form a porous layer between the metal surface of the structure and the carrier, and at least one further material within the pores of the porous layer configured to adhere the chip to the chip carrier.

According to an embodiment, the porous layer is formed over at least one of the metal surface or a surface of the carrier.

According to an embodiment, the porous layer has a thickness ranging from about 1 µm to 150 µm.

According to an embodiment, the particles of the at least one material have diameters ranging from approximately 200 nm to 40 µm.

According to an embodiment, the particles of the at least one material are powder particles.

According to an embodiment, the particles of the porous layer are configured to form pores of the porous layer, wherein the size of the pores is larger than approximately 50 nm.

According to an embodiment, the at least one material is an isolation material.

According to an embodiment, the at least one material is an electrically conductive material.

According to an embodiment, the at least one material is a thermally conductive material.

According to an embodiment, the at least one material is a metal.

According to an embodiment, the at least one material is a ceramic.

According to an embodiment, the at least one material includes at least one of a group consisting of: copper, nickel, silver, palladium or gold.

According to an embodiment, the at least one material is configured to suppress eddy current losses.

According to an embodiment, the at least one further material includes a polymer.

According to an embodiment, the at least one further material includes an organic material.

According to an embodiment, the at least one further material includes a thermosetting material.

According to an embodiment, the at least one further material is a low viscosity material.

According to an embodiment, the at least one further material includes at least one of the following group of materials: epoxide, polyimide (dissolved and/or undissolved), silicone or acrylate.

According to an embodiment, the at least one further material is a non-adhesive material.

According to an embodiment, the at least one further material is configured to provide adhesion of the porous layer with the metal surface of the structure and the carrier due to the flow of the at least one further material within the pores of the porous layer.

According to an embodiment, the at least one further material is configured to enhance the wettability of the porous layer with the metal surface of the structure and the carrier.

According to an embodiment, the structure includes part of a semiconductor chip.

According to an embodiment, the carrier includes a printed circuit board.

According to an embodiment, the carrier includes a chip.

According to an embodiment, the carrier includes a semiconductor wafer.

According to an embodiment, the carrier includes a leadframe.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for attaching a metal surface to a carrier, the method comprising:
depositing a porous layer over at least one of a metal surface and a side of a carrier;

disposing the metal surface and the side of the carrier to face each other with the porous layer disposed between the metal surface and the side of the carrier; and bringing a material into pores of the porous layer such that at least a portion of the material and at least a portion of the porous layer are disposed between the metal surface and the side of the carrier, resulting in a composite of the material and the porous layer forming an interconnection from the metal surface to the carrier.

2. The method according to claim 1, wherein depositing a porous layer over the at least one of a metal surface and a side of a carrier comprises depositing a porous layer having a thickness ranging from about 1 µm to 150 µm.

3. The method according to claim 1, wherein depositing a porous layer over the at least one of a metal surface and a side of a carrier comprises depositing particles over the at least one of a metal surface and a side of a carrier, thereby forming pores of the porous layer.

4. The method according to claim 3, wherein forming pores of the porous layer comprises forming pores which are larger than about 50 nm.

5. The method according to claim 3, wherein depositing particles over the at least one of a metal surface and a side of a carrier comprises depositing particles having diameters ranging from about 200 nm to 40 µm.

6. The method according to claim 3, wherein depositing particles over the at least one of a metal surface and a side of a carrier comprises depositing particles comprising an isolation material.

7. The method according to claim 3, wherein depositing particles over the at least one of a metal surface and a side of a carrier comprises depositing particles comprising a thermally conductive material.

8. The method according to claim 3, wherein depositing particles over the at least one of a metal surface and a side of a carrier comprises depositing particles comprising at least one of a metal and a ceramic.

9. A method for attaching a chip to a chip carrier, the method comprising:
    depositing a porous layer over at least one of a side of a chip and a side of a chip carrier;
    disposing the side of the chip and the side of the chip carrier to face each other with the porous layer disposed between the side of the chip and the side of the chip carrier; and
    bringing a material into pores of the porous layer such that at least a portion of the material and at least a portion of the porous layer are disposed between the metal surface and the side of the carrier, resulting in a composite of the material and the porous layer forming an interconnection from the chip to the chip carrier.

10. The method according to claim 1, wherein depositing a porous layer over the at least one of a side of a chip and a side of a chip carrier comprises depositing particles over the at least one of a side of a chip and a side of a chip carrier hence forming pores of the porous layer.

11. The method according to claim 10, wherein depositing particles over the at least one of a side of a chip and a side of a chip carrier comprises depositing particles by means of a cold spraying process or by means of a cold plasma process.

12. The method according to claim 10, wherein depositing particles over the at least one of a side of a chip and a side of a chip carrier comprises depositing particles having diameters ranging from about 200 nm to 40 µm.

13. The method according to claim 10, wherein depositing particles over the at least one of a side of a chip and a side of a chip carrier comprises depositing particles comprising at least one of a metal and a ceramic.

14. The method according to claim 10, the method further comprising:
    heating the particles after depositing particles over the at least one of a side of a chip and a side of a chip carrier to cause at least one of the following: sintering of the particles with each other, and adherence of the particles to the at least one of the side of a chip, and the side of a chip carrier.

15. The method according to claim 9, wherein attaching the at least one of a side of a chip and a side of a chip carrier to the porous layer by bringing a material into the pores of the porous layer comprises attaching the at least one of a side of a chip and a side of a chip carrier to the porous layer by bringing a material comprising a thermosetting material into the pores of the porous layer.

16. The method according to claim 10, wherein bringing a material into the pores of the porous layer comprises enhancing the wettability of the porous layer with the chip and the chip carrier.

17. The method according to claim 10, the method further comprising:
    thermally curing the interconnection to secure the interconnection within the porous layer and to secure the chip to the chip carrier.

18. The method according to claim 10, wherein forming an interconnection between the chip and a chip carrier comprises forming an interconnection between the chip and a chip carrier comprising a printed circuit board.

19. The method according to claim 10, wherein forming an interconnection between the chip and a chip carrier comprises forming an interconnection between the chip and a chip carrier comprising a further chip.

20. The method according to claim 10, wherein forming an interconnection between the chip and a chip carrier comprises forming an interconnection between the chip and a chip carrier comprising a leadframe.

21. A chip-packaging module comprising:
    a chip and a chip carrier;
    particles of at least one material configured to form a porous layer between facing sides of the chip and the chip carrier respectively, and
    at least one further material within the pores of the porous layer configured such that a composite of the porous layer and the further material forms an interconnection from the chip to the chip carrier;
    wherein at least a portion of the further material and at least a portion of said one material are disposed between the facing sides of the chip and the chip carrier respectively.

22. The packaging module according to claim 21, wherein the porous layer is formed over at least part of at least one of a surface of the chip and a surface of the chip carrier.

23. The chip-packaging module according to claim 21, wherein the porous layer forms at least part of at least one of a surface of the chip and a surface of the chip carrier.

24. A packaging module comprising:
    a structure comprising at least one metal surface;
    a carrier;
    particles of at least one material configured to form a porous layer between facing sides of the metal surface of the structure and the carrier respectively, and
    at least one further material within the pores of the porous layer configured such that a composite of the porous layer and the further material forms an interconnection from the metal surface of the structure to the carrier;

wherein at least a portion of the further material and at least a portion of said one material are disposed between the facing sides of the chip and the chip carrier respectively.

25. The packaging module according to claim 24, wherein the porous layer is formed over at least one of the metal surface or a surface of the carrier.

26. A method for attaching a metal surface to a carrier, the method comprising:
- depositing a porous layer over at least one of a metal surface and a side of a carrier;
- disposing the metal surface and the side of the carrier to face each other with the porous layer disposed between the metal surface and the side of the carrier; and
- bringing a material into pores of the porous layer such that at least a portion of the material and at least a portion of the porous layer are disposed between the metal surface and the side of the carrier, resulting in the material forming an interconnection between the metal surface and the carrier;
- wherein depositing a porous layer over the at least one of a metal surface and a side of a carrier comprises depositing particles over the at least one of a metal surface and a side of a carrier, thereby forming pores of the porous layer; and
- wherein depositing particles over the at least one of a metal surface and a side of a carrier comprises depositing particles comprising an isolation material.

27. A method for attaching a metal surface to a carrier, the method comprising:
- depositing a porous layer over at least one of a metal surface and a side of a carrier;
- disposing the metal surface and the side of the carrier to face each other with the porous layer disposed between the metal surface and the side of the carrier; and
- bringing a material into pores of the porous layer such that at least a portion of the material and at least a portion of the porous layer are disposed between the metal surface and the side of the carrier, resulting in the material forming an interconnection between the metal surface and the carrier;
- wherein depositing a porous layer over the at least one of a metal surface and a side of a carrier comprises depositing particles over the at least one of a metal surface and a side of a carrier, thereby forming pores of the porous layer; and
- wherein forming pores of the porous layer comprises forming pores which are larger than about 50 nm.

28. A method for attaching a metal surface to a carrier, the method comprising:
- depositing a porous layer over at least one of a metal surface and a side of a carrier;
- disposing the metal surface and the side of the carrier to face each other with the porous layer disposed between the metal surface and the side of the carrier; and
- bringing a material into pores of the porous layer such that at least a portion of the material and at least a portion of the porous layer are disposed between the metal surface and the side of the carrier, resulting in the material forming an interconnection between the metal surface and the carrier;
- wherein depositing a porous layer over the at least one of a metal surface and a side of a carrier comprises depositing particles over the at least one of a metal surface and a side of a carrier, thereby forming pores of the porous layer; and
- wherein depositing particles over the at least one of a metal surface and a side of a carrier comprises depositing particles comprising an isolation material.

29. A method for attaching a chip to a chip carrier, the method comprising:
- depositing a porous layer over at least one of a side of a chip and a side of a chip carrier;
- disposing the side of the chip and the side of the chip carrier to face each other with the porous layer disposed between the side of the chip and the side of the chip carrier; and
- bringing a material into pores of the porous layer such that at least a portion of the material and at least a portion of the porous layer are disposed between the metal surface and the side of the carrier, resulting in the material forming an interconnection between the chip and the chip carrier;
- wherein depositing a porous layer over the at least one of a side of a chip and a side of a chip carrier comprises depositing particles over the at least one of a side of a chip and a side of a chip carrier hence forming pores of the porous layer; and
- wherein depositing particles over the at least one of a side of a chip and a side of a chip carrier comprises depositing particles having diameters ranging from about 200 nm to 40 μm.

* * * * *